(12) United States Patent
Busta (10) Patent No.: US 7,277,314 B2
(45) Date of Patent: Oct. 2, 2007

(54) MOBILE ION MEMORY

(75) Inventor: Heinz H. Busta, Park Ridge, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 573 days.

(21) Appl. No.: 10/855,281

(22) Filed: May 27, 2004

(65) Prior Publication Data

US 2005/0276143 A1    Dec. 15, 2005

(51) Int. Cl.
  *G11C 13/00*    (2006.01)
(52) U.S. Cl. .................. 365/118; 365/222; 365/151
(58) Field of Classification Search ............... 365/118, 365/222, 185.24, 151, 36, 52, 189.09
  See application file for complete search history.

(56) References Cited

U.S. PATENT DOCUMENTS

| | | | |
|---|---|---|---|
| 4,090,253 A | 5/1978 | Salgo | |
| 5,161,147 A | 11/1992 | Goldberg et al. | |
| 5,166,919 A | 11/1992 | Eigler | |
| 5,216,661 A | 6/1993 | Potember et al. | |
| 5,287,342 A | 2/1994 | Kishi et al. | |
| 5,324,548 A | 6/1994 | Ogawa et al. | |
| 5,439,777 A | 8/1995 | Kawada et al. | |
| 5,716,674 A | 2/1998 | Ohtake et al. | |
| 5,978,256 A * | 11/1999 | Sohn et al. | 365/151 |
| 6,304,481 B1 | 10/2001 | Hurt | |
| 6,528,807 B1 * | 3/2003 | Koops et al. | 250/492.3 |
| 6,562,633 B2 | 5/2003 | Misewich et al. | |
| 2002/0110074 A1 | 8/2002 | Gibson | |
| 2003/0081527 A1 | 5/2003 | Gibson et al. | |
| 2003/0081533 A1 | 5/2003 | Gibson | |

OTHER PUBLICATIONS

Vettiger et al, "The Nanodrive Project," *Scientific American*, 288 (1), 47-53 (Jan. 2003).

* cited by examiner

*Primary Examiner*—Anh Phung
*Assistant Examiner*—Dang Nguyen
(74) *Attorney, Agent, or Firm*—Steven Weseman; Phillip Pippenger; Thomas Omholt (57) ABSTRACT

An improved high-density digital storage device uses placement of mobile ions within a memory layer to record digital data. In an embodiment of the invention, the mobile ions comprise sodium ions or other alkali metal ions implanted in a silicon oxide memory layer. In a further embodiment of the invention, a scanning nanotip array is used to position the mobile ions via an electric field as well as to read the positions of the mobile ions. In a further embodiment of the invention, a grid-addressable array of transistors is used to provide scanning tips.

22 Claims, 10 Drawing Sheets

MOBILE ION MEMORY

FIELD OF THE INVENTION

This invention relates generally to data storage and, more particularly, relates to a system and method for storing data via the positioning of mobile ions within a memory using one or more probes to read, write, and erase data.

BACKGROUND

As computer CPUs, graphic cards, transmission means, and other elements and facilities increase in speed and complexity, they become able to handle increasingly greater amounts of data. This is beneficial in that it allows for the execution of more complex tasks in shorter amounts of time, to the benefit of users. However, computer memory is a key resource that often affects machine speed and capabilities, and the advances in other areas cannot be fully effective without concomitant advances in memory capabilities.

One primary measure of the effectiveness of computer memory technologies is memory density. Often this is given in terms of bits per $cm^2$ of materials, or $b/cm^2$. Memory technologies have advanced to the point that memory densities on the order of 62.5 $Gb/cm^2$ are attainable using certain experimental approaches. For example, in "The Nanodrive Project," by Vettiger et al, Scientific American, page 47 of the January 2003 issue (the identified article being incorporated herein by reference in its entirety without exclusion of any portion thereof), such a memory system is described. The Vettiger memory system employs an array of 4000 cantilevers, each of which can be electrically heated to 400 degrees Celsius and flexed, via the heating effect, to form an imprint in a plastic writing surface. The imprint may be on the order of 40 nm across. Reading the pits thus formed is done by scanning the tips, heated to a lesser temperature than the writing temperature, across the writing surface and recording changes in temperature and electrical impedance caused when a tip encounters a pit. Erasing of data is performed by reheating a tip to the writing temperature and using the hot tip to fill in the pit.

While the Vettiger system allows for fairly high memory densities, there are a number of drawbacks inherent in the system that hamper its use in practical applications. For example, electrically heating the cantilever tips is resource intensive, potentially requiring as much as a watt of power to heat the example array of 4000 tips. In addition, the writing surface may not be completely smoothed by the erase process, causing potential errors on subsequent write/read cycles.

More traditional memory technologies do not suffer the aforementioned power and accuracy limitations, but offer much lower memory density. For example, some of best DRAMs available have densities on the order of 0.05-0.1 $Gb/cm^2$. Moreover, the access time for such memories is relatively slow. While SRAMs are typically faster, they tend to have lower densities. In addition, both DRAMs and SRAMs are typically volatile. Thus a memory technology is needed that offers improved memory density without incurring the costs and limitations discussed above.

BRIEF SUMMARY OF THE INVENTION

Embodiments of the invention provide novel data storage architectures and methods of construction and use of the same. In an embodiment of the invention, a memory layer comprised of a silicon dioxide contains mobile ions. The memory layer rests on a substrate, such as made of crystalline silicon or otherwise. The substrate provides both mechanical support and electrical connectivity in an embodiment of the invention. The memory layer may be preconditioned so that the mobile ions rest together in substantially a monolayer or multi-layer arrangement. In an embodiment of the invention, the preconditioning is executed by pressing a contact, such as a silicon wafer, against the memory layer and applying a repulsive bias voltage to group the mobile ions at the interface between the memory layer and the substrate. Elevating the temperature of the memory layer will increase the ease of conditioning by increasing ion mobility. In another embodiment of the invention, a conductive layer is fabricated on top of the memory layer and is used to precondition the layer as described above before being removed, such as via etching, etc.

The data storage device according to the aforementioned embodiments of the invention can be used to digitally store information. In particular, the information to be stored is recorded via the positions of the ions. In an embodiment of the invention, one or more nanotips are used to write, read and erase information by manipulating the positions of one or more mobile ions. The ions are responsive to a threshold field to move within the memory layer, such that when a nanotip applies a field of the proper polarity at or above the threshold field strength, one or more ions within the field will move to one surface or the other of the memory layer. With respect to writing, a negative bias on the nanotip causing a field at or above the threshold strength can be considered a "write" or "1" bias for positive ions. The same level bias with opposite polarity can be considered an "erase" or "0" bias for such ions. Elevating the memory temperature during writing decreases the field strength necessary, but the temperature should be limited (e.g. ~100 C) since excess heat may cause unwanted ion diffusion and loss of data.

Ions at the top surface, i.e. the surface exposed to the nanotip, can then be detected while ions at the opposite surface of the memory layer are not detected (or not as strongly detected, or give a distinctively different signal). In a preferred embodiment of the invention, detection of the presence and/or absence of surface ions is accomplished by sensing variations in the flat band voltage of the memory layer or via other means. Reading of recorded data from the memory layer is performed by scanning the same tip or tips used for writing over the surface and using gathered electrical data to detect the ions nearest the scanning tip, i.e. those at the write surface of the memory layer.

In an alternative embodiment of the invention, the scanning tips are not nanotips in a cantilever array, but rather are conductive tips embedded in a solid state addressable array. Each tip is comprised of the drain of a field effect transistor. The sources and gates of the transistors associated with the tips are interconnected, such that there are a number of source leads or lines and a number of gate leads or lines. The individual tips are addressed for reading and writing via coordinated activation of particular source and gate lines. In addition, the entire body containing the tip array may be translated in a two-dimensional plane via precision piezo electric elements or other actuators, such as those described in the Vettiger article discussed above.

Additional features and advantages of the various embodiments of the invention will be made apparent from the following detailed description of illustrative embodiments which proceeds with reference to the accompanying figures.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

DETAILED DESCRIPTION

The invention pertains to electronic memory, such as may be used to digitally store and retrieve data. In overview, the memory employs at least a memory layer containing mobile ions and a scanning array of nanotips, each tip usable to apply a localized electric field to the memory layer. The localized electric field is strong enough to move the mobile ions to write or erase data. In this manner, data may be stored for very low cost per bit in terms of storage space per bit and energy requirements to write a bit. Modest heating of the memory layer (~100 C) can be used to reduce the necessary field strength.

The invention will be described in greater detail with reference to FIGS. 1-7. Beginning with FIG. 1, an exemplary memory according to an embodiment of the invention is shown schematically. In particular, the memory 101 is comprised of a memory layer 113 and a scanning array comprising at least one scanning tip assembly 103. The scanning tip assembly 103 is made up of a cantilever arm 107 and a tip portion 105. A scanning array of suitable tips is described in Vettiger, discussed above. Although in Vettiger the ability of the arm 107 to independently flex is critical to all read, write, and erase operations, the arm 107 of the scanning tip assembly 103 in the described embodiment of the invention need not be independently actuatable perpendicularly to the surface of the memory layer 113.

Figure 1:
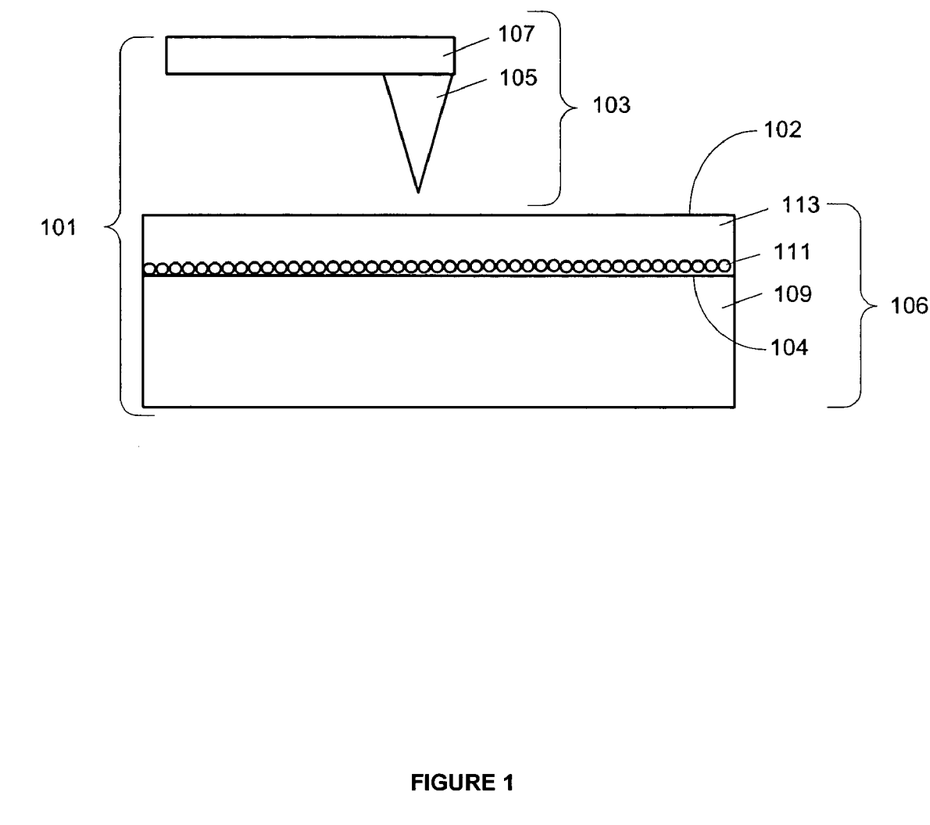
FIG. 1 is a cross-sectional side view of a memory apparatus according to an embodiment of the invention.

The memory layer 113 may be comprised of any suitable material, although in an embodiment of the invention the memory layer 113 is comprised of an amorphous silicon oxide. In an embodiment of the invention, the memory layer 113 comprises amorphous silicon oxide having a thickness between about 3 nm and about 20 nm. The memory layer 113 comprises an upper surface 102 and a lower surface 104, defining the perpendicular bounds of the memory layer 113. A plurality of mobile ions 111 are situated within the width of the memory layer 113, i.e. between or at the upper surface 102 and the lower surface 104. As shown, the mobile ions 111 are aligned in essentially a monolayer, although such is typically the case only after preconditioning as will be discussed below.

For both mechanical support and electrical conductivity, the memory layer 113 preferably rests on a substrate 109, such that the memory layer 113 and substrate 109 together form a structure 106. The substrate 109 may be any suitable material that meets the foregoing criteria, but in an embodiment of the invention, the substrate 109 is preferably comprised of crystalline silicon. As will be appreciated from the discussion hereinafter, in addition to providing mechanical support and electrical conductivity, the substrate 109 may also provide a portion of the source materials for the memory layer 113 in an embodiment of the invention.

As will be described in greater detail below, the scanning tip assembly 103 is scanned across the surface 102 of the memory layer 113, with the tip 105 being either close to or resting on the surface 102. In an embodiment of the invention, the tip 105 is capable of being biased to create a field at or greater than a threshold field strength needed to move one or more mobile ions from a position at or near surface 102 to a position at or near surface 104, or vice versa. In a further embodiment of the invention, the tip 105 is also capable of sensing, topographically or electrically, the presence of one or more ions at the surface 102, as will be described in greater detail hereinafter.

Figure 2A:
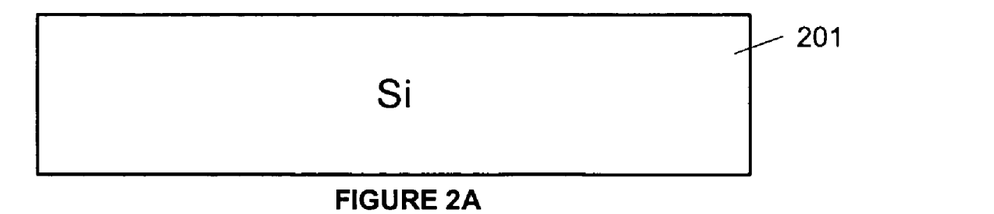
FIG. 2A is a cross-sectional side view of a memory apparatus according to an embodiment of the invention at a first stage of construction.

Referring to FIGS. 2A-2F, a multi-step method of producing a storage structure such as structure 106 of FIG. 1 is shown. In particular, as shown in FIG. 2A and step 701 of the production process flow chart of FIG. 7, the production process begins with a suitable substrate 201 such as comprised of a slice or wafer of crystalline silicon. Although the thickness of the substrate 201 is on the order of several microns in an embodiment of the invention, such is not critical, and the substrate 201 may be of any convenient thickness, including any thickness much greater or lesser than that described above without limitation.

Figure 2B:
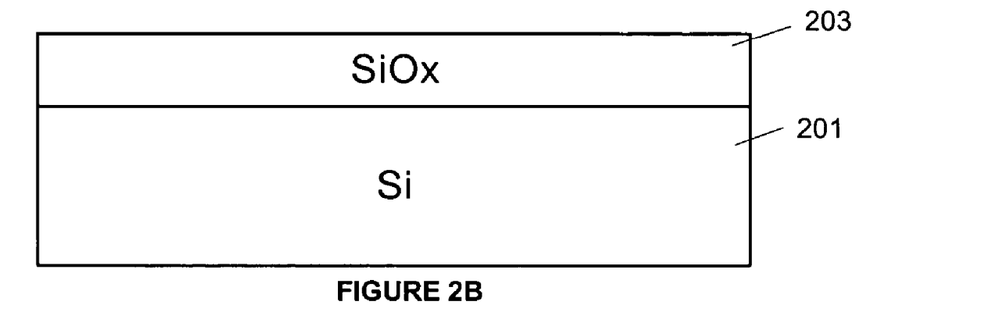
FIG. 2B is a cross-sectional side view of a memory apparatus according to an embodiment of the invention at a second stage of construction.
Figure 7:
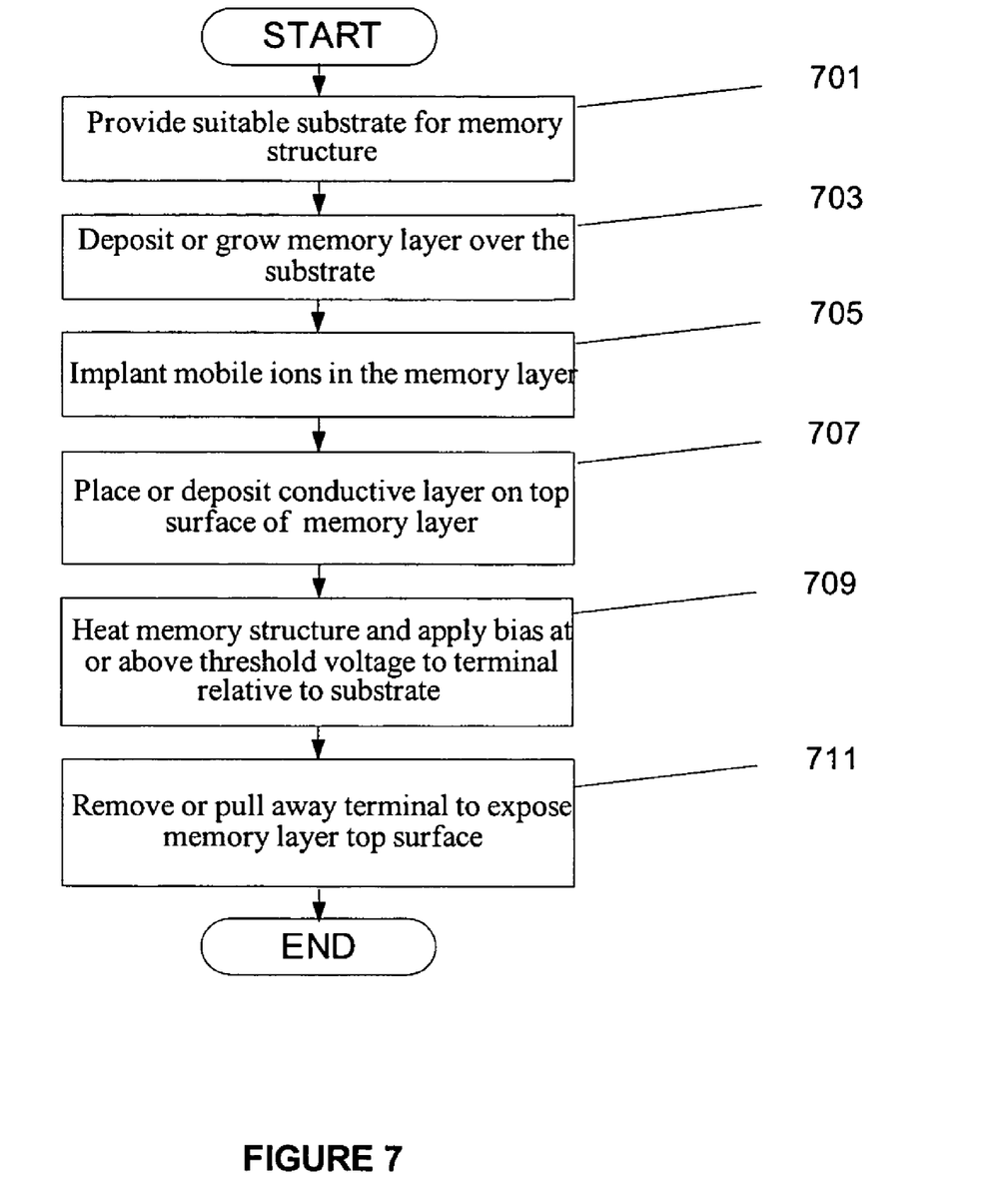
FIG. 7 is flow chart showing exemplary steps for making a memory structure according to an embodiment of the invention.

A shown in FIG. 2B, and step 703 of the production process flow chart of FIG. 7, a memory layer 203 is placed over the substrate 201. The memory layer 203 may be comprised of an amorphous silicon oxide such as silicon dioxide or other suitable material and may be either grown on or deposited on substrate 201. In the former case, the layer 203 is actually comprised of material that previously formed portion of the substrate 201. In any case, it is preferred that the top surface 202 of the layer be physically smooth so as to allow accurate scanning for reading, writing, and erasing. Accordingly, a smoothing step, such as via chemical mechanical polishing (CMP), may be employed if needed.

Figure 2C:
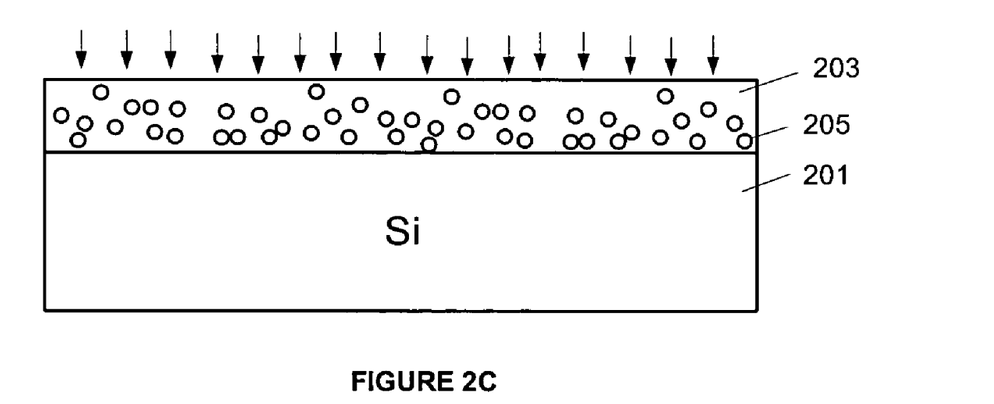
FIG. 2C is a cross-sectional side view of a memory apparatus according to an embodiment of the invention at a third stage of construction.

In the third process step, as shown in FIG. 2C and step 705 of the production process flow chart of FIG. 7, mobile ions 205 are put into the memory layer 203. An ion concentration of about $1 \times 10^{15}$ ions/cm$^2$ is desirable in an embodiment of the invention so as to provide substantially monolayer coverage on average. Any suitable ions and placement mechanism may be used for this step, but in an embodiment of the invention, sodium ion implantation is employed after the layer 203 is formed or situated. In another embodiment of the invention, sodium ions are incorporated during the creation or growth of the layer 203. The ion type is not critical, and in an embodiment of the invention the ion is selected from among the alkali metals. It should be noted that other ion types are usable as well within embodiments of the invention. Moreover, it is possible that multiple ion types may be used in implementing embodiments of the invention.

Once the mobile ions 205 are within the memory layer 203, it is desirable to precondition the memory layer 203 such that the mobile ions 205 are driven to the interface between the memory layer 203 and the substrate 201. There are several ways in which this step can be performed, however two specific suitable methods will be discussed herein by reference to FIG. 2D.

Figure 2D:
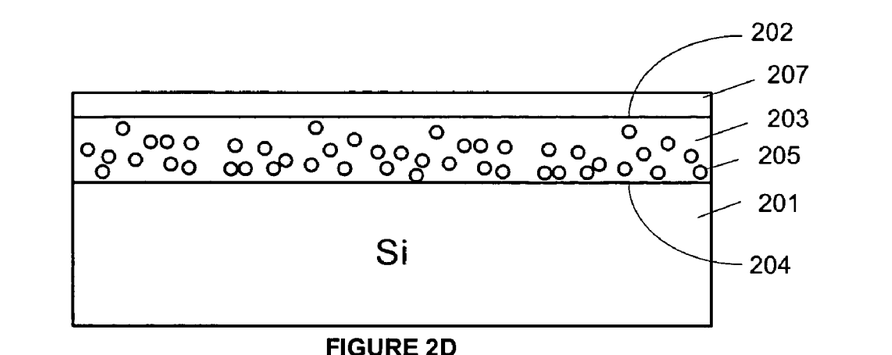
FIG. 2D is a cross-sectional side view of a memory apparatus according to an embodiment of the invention at a fourth stage of construction.

In the first method, a conductive layer 207, such as a metallic layer, is deposited on the top surface of the memory layer 203, as shown in FIG. 2D and in step 707 of the production process flow chart of FIG. 7. According to an alternative embodiment, the terminal 207, such as comprising a wafer of silicon, is simply pressed against the top surface 202 of the memory layer 203, also as shown in FIG. 2D and in step 707 of the production process flow chart of FIG. 7. Whichever method is used, the following step is essentially the same.

Figure 2E:
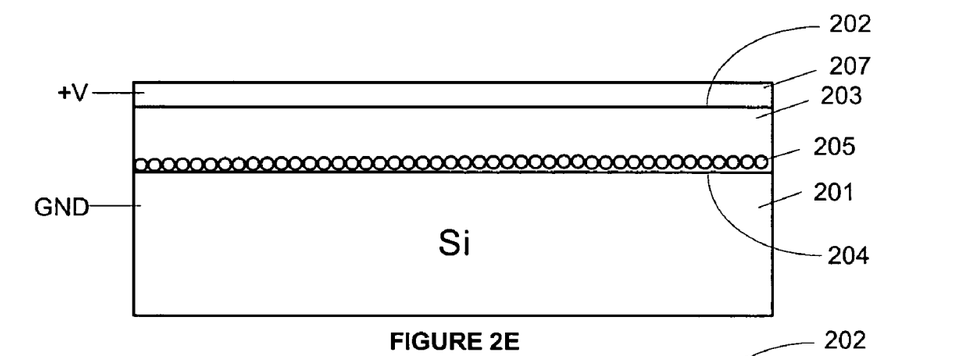
FIG. 2E is a cross-sectional side view of a memory apparatus according to an embodiment of the invention at a fifth stage of construction.

As shown in FIG. 2E and in step 709 of the production process flow chart of FIG. 7, once a terminal 207 is in place, either by being deposited on the memory layer 203 or placed against the memory layer 203, the memory layer 203 may be preconditioned. In an embodiment of the invention, the preconditioning step comprises driving substantially all of the mobile ions 205 to the interface between the memory layer 203 and the substrate 201. This can be done by heating the memory layer 203 to a suitable temperature such as 100 degrees Celsius, via conductive, radiative, or other heating means, and establishing a suitable electric field gradient between the top 202 and bottom 204 surfaces of the memory layer 203.

A field applied between the top 102 and bottom 104 surfaces of the memory layer 203 will suffice if it is of sufficient polarity and magnitude relative to the ion polarity and mobility. For positive ions such as Sodium, such a field may be established, for example, by placing a positive bias +V on the terminal 207, and a lower bias, such as ground (GND) on the substrate 201. After allowing a brief moment for the ions to move in response to the applied field, the ion arrangement is substantially as shown in FIG. 2E according to an embodiment of the invention. In an embodiment of the invention, the memory layer 203 is cooled after such alignment, with the bias still applied, to ensure that thermal ion movement in the heated memory layer 203 does not substantially disrupt the alignment.

Note that in alternative embodiments, preconditioning steps and/or results may vary, or in another embodiment of the invention preconditioning may be omitted if desired. For example, if the ions are negative, then the applied field should be reversed to arrive at the same ion configuration. In an embodiment of the invention, the preconditioning steps are altered to force the ions to the top surface 202 rather than the bottom surface 204, of the memory layer 203. This can be accomplished by simply reversing the direction of the applied field while leaving the magnitude unchanged since the ion mobility is typically not directional.

As noted, in an alternative embodiment of the invention, the preconditioning step is omitted and the writing ability of a scanning tip as described in reference to FIG. 1 is used instead to simply "write" all the ions to an initial state by scanning the memory and applying a write field. In this embodiment of the invention, the memory layer 203 need not be heated, but can be.

Figure 2F:
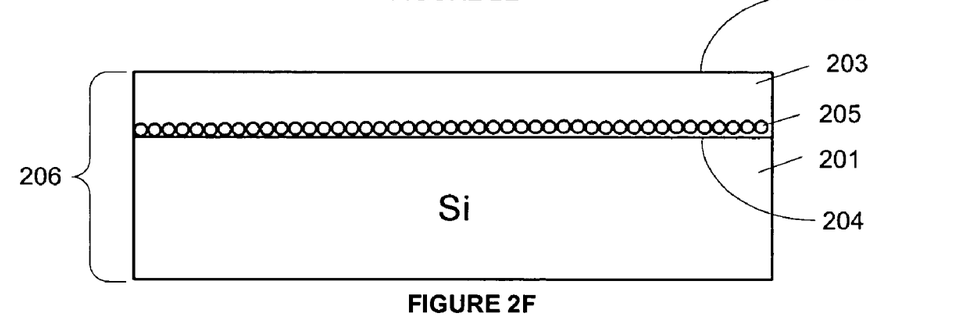
FIG. 2F is a cross-sectional side view of a memory apparatus according to an embodiment of the invention at a sixth stage of construction.

In the event that a terminal 207 has been used to precondition the memory layer 203, the terminal is subsequently removed in step 711 to yield the bare preconditioned memory structure 206 as shown in FIG. 2F. If the terminal 207 was deposited then it is removed, such as by etching, CMP, etc. If instead the terminal 207 was simply pressed to the surface 202, then it is simply pulled away in the same manner as it was applied.

The use of a memory according to an embodiment of the invention will be described in greater detail at this point with reference to FIGS. 3A, 3B, 4, 5, and 6. As described above in overview, the data storage device according to the aforementioned embodiments of the invention can be used to digitally store information via the positions of the ions, with one or more nanotips (a nanotips array) being employed to write, read and erase by positioning one or more mobile ions. With respect to writing and erasing of data, the nanotip applies a field of the proper polarity at or above the threshold field strength to move the one or more ions to one surface or the other of the memory layer. Thus, for example, for positive ions, a negative bias on the nanotip causing a field at or above the threshold strength can be considered a "write" or "1" bias. The same level bias with opposite polarity can be considered an "erase" or "0" bias.

With respect to retrieving recorded data, ions at the upper surface exposed to the nanotips can be detected either physically (such as by topographical means) or electrically (such as by the capacitance differenial resulting from the ionic positions), while ions at the opposite surface of the memory layer are not physically detected (and additionally yield a distinguishable electrical signal). In an embodiment of the invention, reading a plurality of bits of stored data from the memory layer is done by scanning the tip or tips used for writing over the surface and using the electrical or topological characteristics of the surface to detect the ion positions and hence the data recorded by way of those positions. Exemplary techniques for reading data from the memory layer will be discussed in greater detail below with reference to FIG. 6.

Figure 3A:
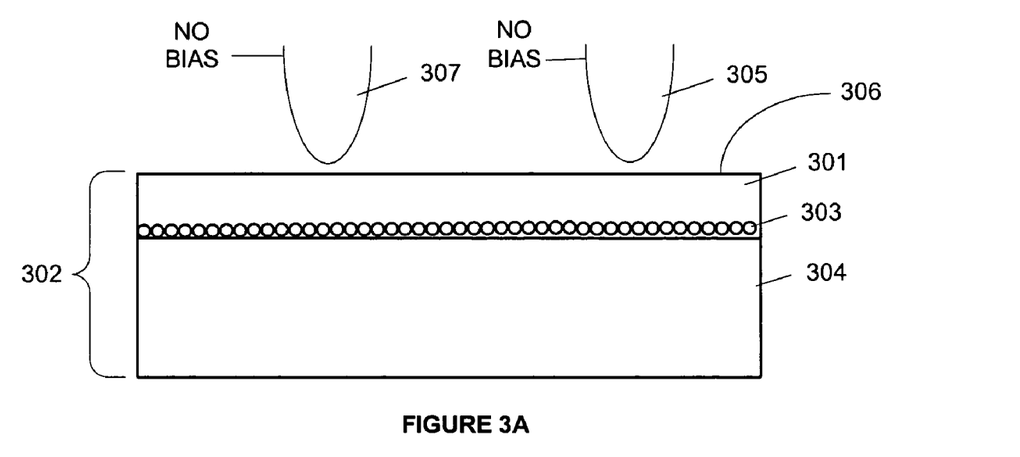
FIG. 3A is a cross-sectional side view of a memory apparatus according to an embodiment of the invention prior to a write operation.

The writing, erasing, and reading mechanisms according to an embodiment of the invention will now be described in greater detail. As shown in FIG. 3A, the memory structure 302, comprising a memory layer 301 having mobile ions 303 and a substrate 304, is in an initial state, e.g. subsequent to preconditioning or otherwise, with the ions 303 resting at respective individual ion positions. Nanotips 305, 307, which are part of one or more respective nanotips arrays, are positioned near or in contact with the surface 306 of the memory layer 301. As shown, the tips 305, 307 are initially unbiased.

Figure 3B:
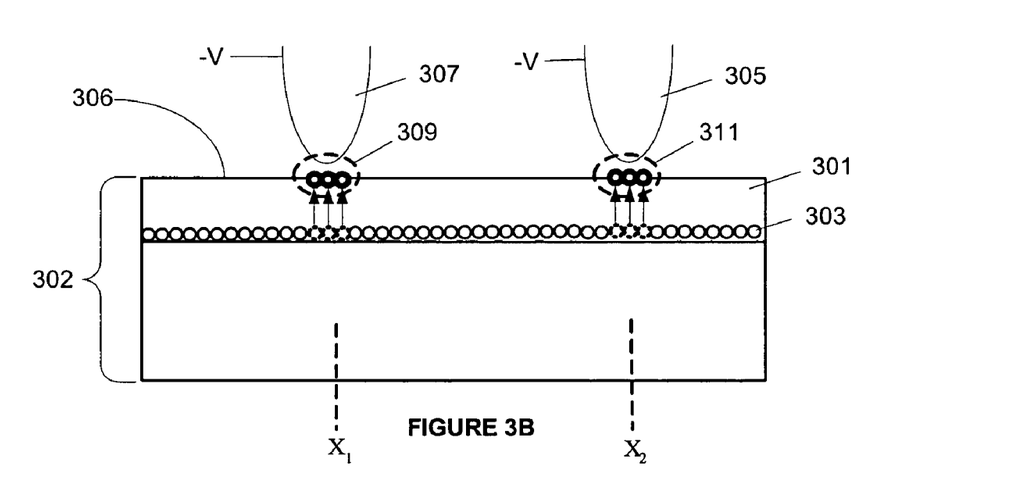
FIG. 3B is a cross-sectional side view of a memory apparatus according to an embodiment of the invention subsequent to a write operation.

The use of the structure of FIG. 3A for digitally writing data is shown in greater detail in FIG. 3B. In particular, the tips 305, 307 are biased to produce a field of the appropriate direction considering the ion polarity and desired ion position. In the illustrated example, the ions are positive and the desired ion position for a "write" operation is at the top surface 306 of the memory layer 301. Accordingly, a negative voltage (−V) is applied to each tip 305, 307 when the tips are in the desired write positions $X_1$ and $X_2$. The resultant electrical field is preferably at or above the threshold field strength required to cause ion motion.

Note that the threshold field strength may be a property of the ion type, the material type of the memory layer, and the device temperature, and will typically not be a function of the device geometry. However, the actual applied bias required, i.e. the write or erase bias, will typically be a function of the threshold field strength, the memory layer thickness, the memory layer material, the ion type, the device temperature, the shape of the nanotips, and the distance between the closest point on the nanotips and the memory layer, as well as potentially other factors. This bias magnitude will be referred to as the threshold voltage.

The result of the write operations is to move ions to create ion groups 309, 311 at the surface 306 of the memory layer 301. Typically, a particular item of data will comprise many bits, and thus the writing of such data will comprise either a number of write operations by a single tip or a lesser number of writes by a plurality of tips as shown. Although the ions 303 of the memory structure 302 are mobile in an applied field of the appropriate threshold strength and appropriate direction (a "write" or "erase" field), the ions preferably do not move or diffuse substantially in the absence of such a field. Thus, the recorded data may be stably stored for future retrieval. As discussed hereinafter, the read operation is preferably non-destructive, so that multiple reads of the same data is possible in an embodiment of the invention.

In an embodiment of the invention, the memory layer is cooled while data is stored therein to ensure continued integrity of the data. For example, depending upon the chosen ion, the memory layer material, and the operating environment, thermal ion movement may alter one or more ion positions and thus may alter the data stored in the memory. The cooling means is not critical, but one such means is a thermoelectric cooler (e.g. a Peltier cooler). Other means include liquefied gases (helium, nitrogen), etc.

Figure 4:
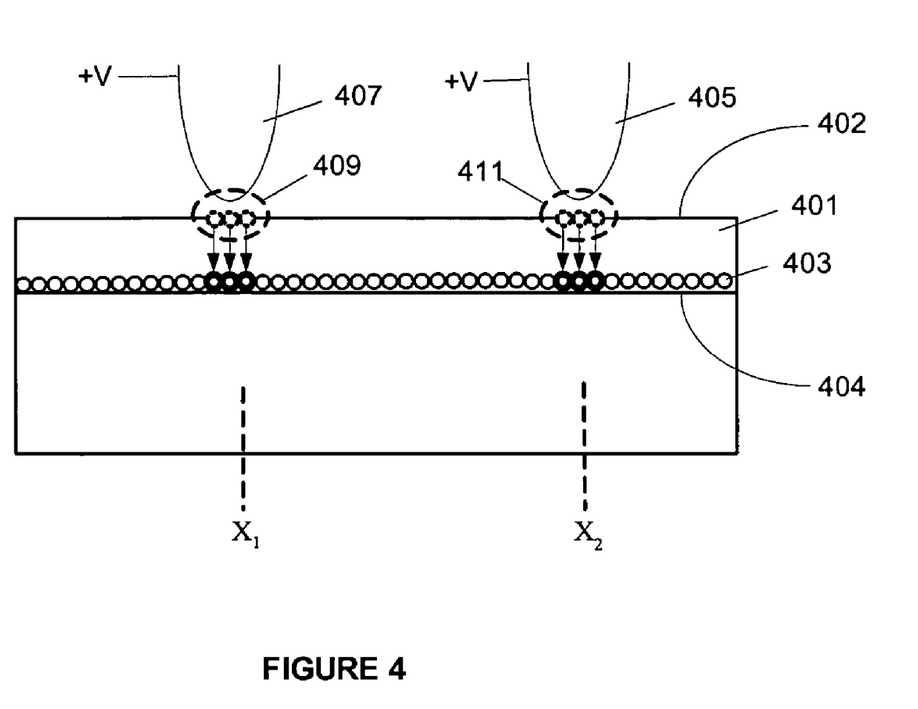
FIG. 4 is a cross-sectional side view of a memory apparatus according to an embodiment of the invention during an erase operation.

FIG. 4 illustrates an exemplary erasure process according to an embodiment of the invention. In particular, with the tips 405, 407 at the appropriate locations, i.e. $X_1$ and $X_2$, an erase signal of the threshold voltage is applied to each tip 405, 407, resulting in erase fields within the memory layer 401 at those locations. In the illustrated example, the ions 403 are positive, and a surface ion group is read as a "1," and thus the appropriate erasure field is a decreasing field between the top surface 402 and the bottom surface 404 of the memory layer 401, with a magnitude at or above the threshold field strength. Accordingly, in order to erase data in the illustrated example a positive voltage at or above the threshold is applied to each tip. Note that the write and erase operations may use different tips and/or numbers of tips than were used for the write operation. For example, although FIG. 3 shows tips 305 and 307 used in the write operation, the erase operation may use only one of these tips alone or in conjunction with other tips, or may use an entirely different tip or set of tips. As shown, the result of the erase operation described above is that the previously written ion groups 409, 411 are moved from the top surface 402 of the memory layer 401 to the bottom surface 404 thereof. Although the resultant configuration of the ions 403 is shown as a uniform monolayer, it will be appreciated that the ions need not be at uniform depths within the layer 401 so long as they do not create read errors, i.e. so long as they are not detectable at the top surface 402 via a typical read operation.

Figure 5:
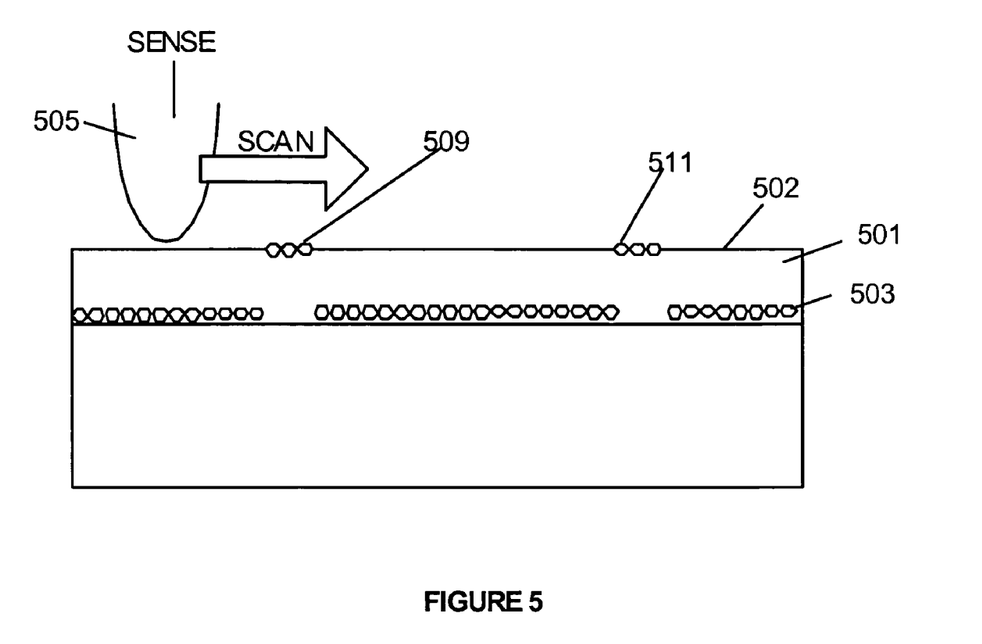
FIG. 5 is a cross-sectional side view of a memory apparatus according to an embodiment of the invention during a read operation.

FIG. 5 illustrates a typical read operation using the structure of the illustrated embodiment of the invention. In particular, one or more tips represented by tip 505 are scanned across the top surface 502 of the memory layer 501. Scanning may be by any suitable mechanism that allows the requisite resolution and range of movement, such as piezo electric mechanisms, highly accurate mechanical reduction mechanisms, etc. as are well-known to those of skill in the art. As shown, due to a prior write operation (or selective erase operations) ion groups 509, 511 are located at the top surface 502 of the memory layer 501. As the tip 505 is scanned across the surface, it is used to sense variations in the surface characteristics (electrical or topographical) due to ion groups such as groups 509 and 511. As noted above, the read operation may involve one tip or a plurality of tips.

As noted, detection of variations in flat band voltage is a preferred data reading mechanism. With respect to the alternative mechanism of sensing surface topography, it will be appreciated that many topographical sense mechanisms are themselves electrical in operation. For example, detection of tunneling current in either a constant height or constant current mode can be used to detect surface topology. Moreover, with respect to sensing surface topography, it should be noted that the selection of materials and configuration will affect the change in surface topography due to the presence of mobile ions. For example, in many cases ions that are positioned at the read surface of the memory layer will not cause any topographical variations on the surface, as they will not protrude substantially.

Figure 6:
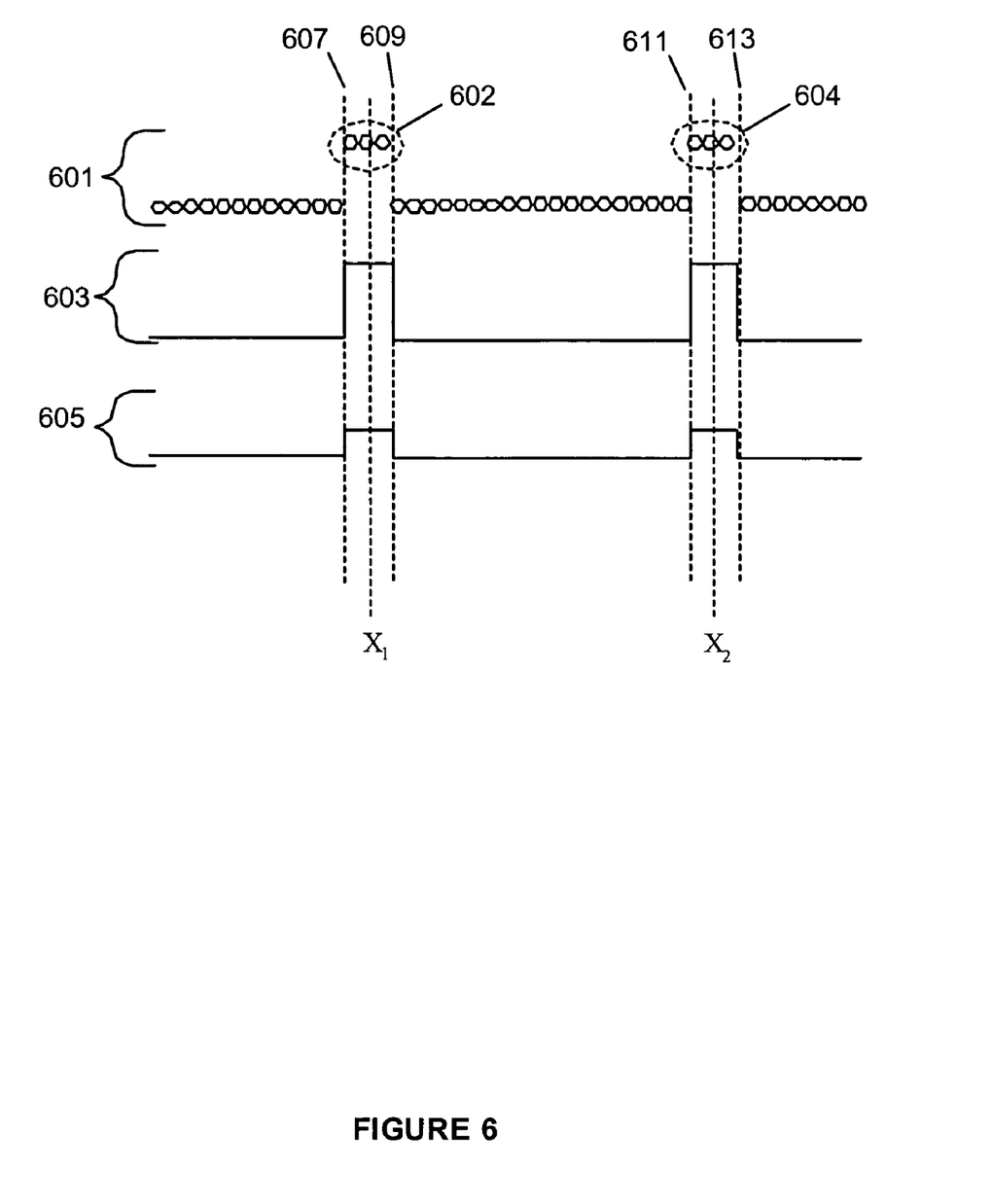
FIG. 6 is a relational diagram relating ion position to topographical and electrical features according to an embodiment of the invention.

The relationship of the surface topology to the detectable quantities is shown in FIG. 6. In particular, the ion positions are represented in element 601. As shown, the ion positions are predominantly at the bottom surface of the memory layer, although groups 602 and 604 are at the top surface. Each group represents one bit of data. Group 602 begins at a first position 607 and ends at a second position 609. Group 604 begins at a first position 611 and ends at a second position 613. The resolution of writing and reading in each dimension (the dimension shown as well as the dimension directed into the page) in the illustrated embodiment of the invention is approximately three ions, for a total bit group size of approximately nine ions (3×3), or an ion and its neighbors.

As one or more tips are scanned across the memory layer, the ion groups 602 and 604 are sensed as either electrical characteristic variations shown in element 605, or as topographical variations, shown in element 603. For the reader's convenience, the elements 603 and 605 are shown correlated in position with the ion array 601 embodying the differences. Thus, by reading such characteristic variations while scanning the memory, the data stored in the scanned locations may be nondestructively read out.

Referring now to the portion 605 of the plot of FIG. 6, the referenced electrical characteristic variations may be of any type. However, in an embodiment of the invention, the electrical characteristic is the flat band voltage, with a variance therein indicating the presence of a group of ions near the memory layer surface. The change in the flat band voltage can be roughly calculated as follows for an exemplary 30 Å thick memory layer of $SiO_2$ having sufficient mobile ion density for approximately monolayer coverage: $\Delta V = Q/C$, where Q represents the charge per unit area and C represents the capacitance per unit area. Moreover, Q can be calculated as follows: $Q=qN$, where q is the electron charge ($1.6\times10^{-19}$ Coulomb (C)) and $N=1\times10^{15}$ ions/cm$^2$ (representing sufficient density for monolayer coverage). Thus, $Q=1.6\times10^{-4}$ C/cm$^2$. Now, with C given by $\epsilon_0\epsilon/t$, and with $\epsilon^0=8.86\times10^{-14}$ Farad/cm, $\epsilon=4.5$ (for $SiO_2$), and t=30Å, it can be seen that $C=1.33\times10^{-6}$ F/cm$^2$, and $\Delta V=120V$. Thus, it can be seen that in the given example, a strong flat band voltage change will be detected where groups of ions have been moved to (or left at) the surface of the memory layer to be read. Reading this flat band voltage change will enable one to identify "written" locations, and thus to read back the data stored in the memory layer via the ion positions.

Although the foregoing embodiments of the invention have been discussed using a nanotip array for purposes of illustration, other tip arrangements and mechanisms are contemplated within the scope of the invention. One exemplary alternative arrangement is discussed hereinafter with reference to FIGS. 8 and 9.

Figure 8:
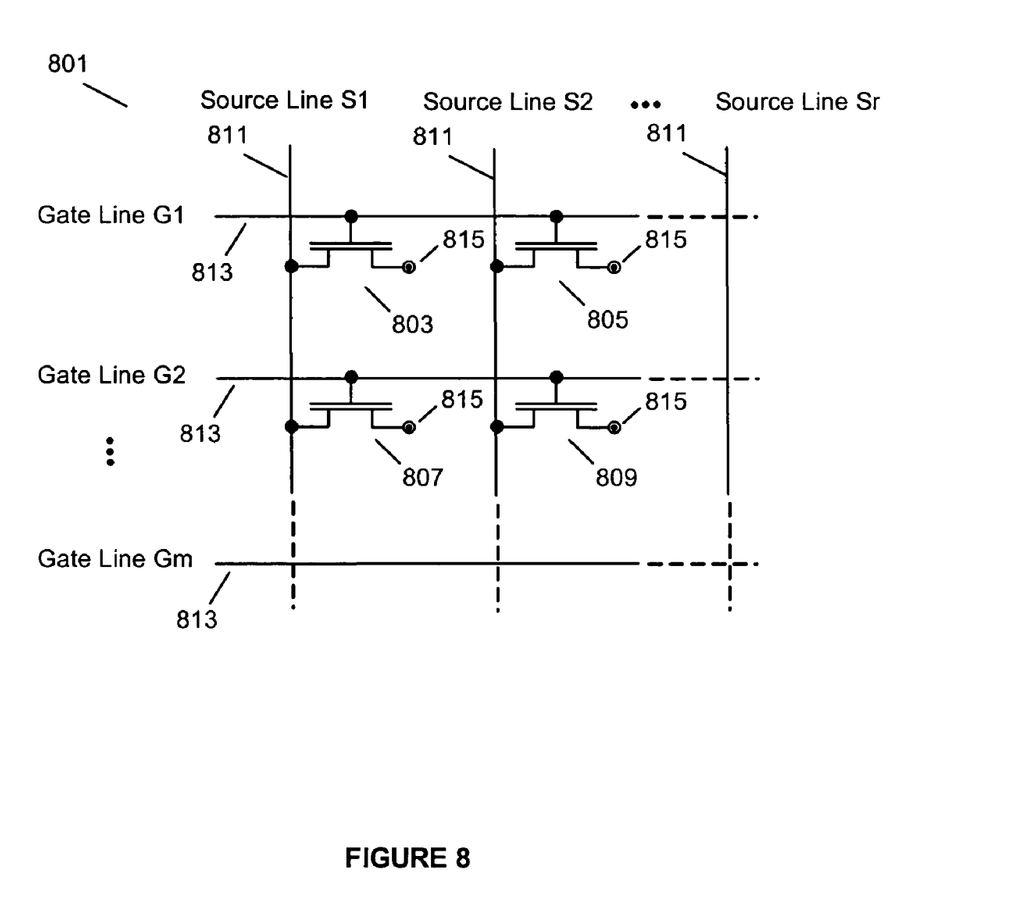
FIG. 8 is a schematic view of a tip array according to an alternative embodiment of the invention, showing interconnections between transistors associated with individual tips of the array.

FIG. 8 represents a schematic view of a tip array according to an alternative embodiment of the invention, showing interconnections between transistors associated with individual tips of the array. In particular, an m×n array 801 of interconnected transistors is shown. For the sake of clarity, only four transistors 803, 805, 807, 809 are shown. The source of each of the transistors 803, 805, 807, 809 is connected to one of source lines S1, S2 . . . Sn (811), while the gate of each of the transistors 803, 805, 807, 809 is connected to one of gate lines G1, G2 . . . Gm (813). The drain of each of the transistors 803, 805, 807, 809 is connected to a tip 815. By applying a voltage or reading a voltage at any pair of one source line 811 and one gate line 813, the unique transistor connected to that pair of lines may be activated or read, writing to or reading from a mobile ion memory layer respectively.

Figure 9:
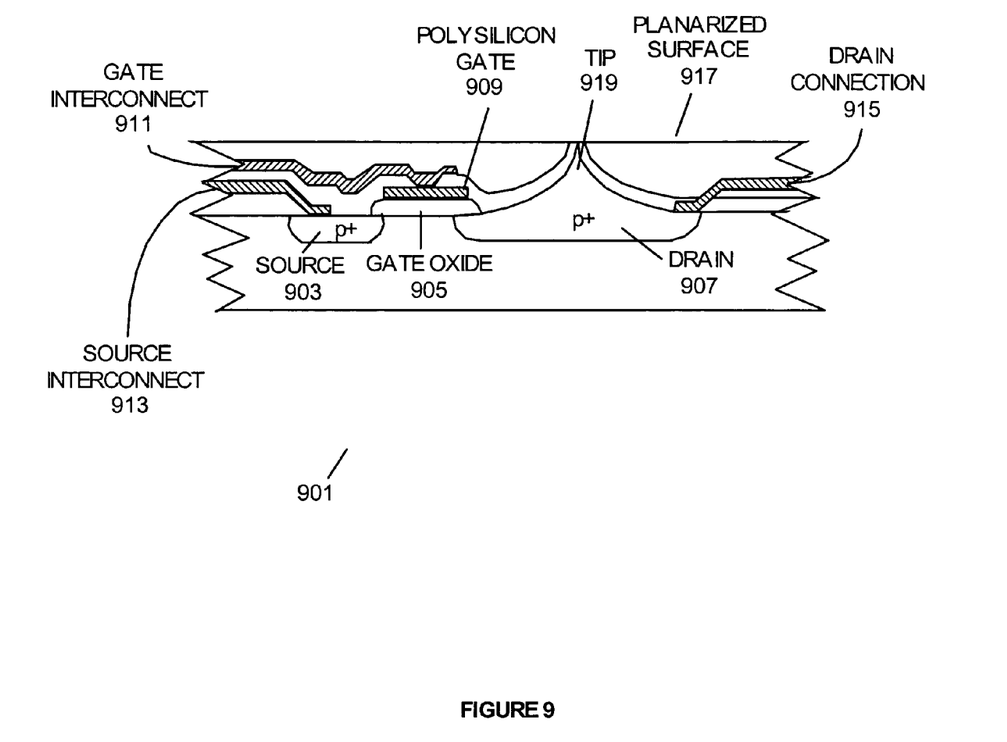
FIG. 9 is a cross-sectional side view of a portion of a tip array according to an alternative embodiment of the invention.

A more detailed view of the transistor and interconnection structure is shown in FIG. 9. In particular, FIG. 9 illustrates a cross-sectional side view of a portion of a tip array according to an alternative embodiment of the invention. The illustrated structure 901 can be manufactured using standard integrated circuit (IC) fabrication techniques. The structure 901 is a modified transistor structure that extends the drain 907 to a tip 919 for writing to and reading from a mobile ion memory layer as discussed above.

The remainder of the structure will be familiar to those of skill in the art. In particular, the source 903 and gate 909 are connected to a source interconnect 913 and a gate interconnect 911 respectively, as discussed with respect to FIG. 8. A gate oxide structure 905 insulates the gate 909 from the source 903 and drain 907. A drain connection 915 may be fabricated as well to analyze the drain voltage.

It will be appreciated that the surface 917 of the structure 901 is planarized. Any traditional means of planarization may be used, however field enhancement and terabit-densities are possible largely because of the sharpness of the tip 919. Accordingly, care should be taken in planarization not to smooth the tip 919. Over smoothing of the tip 919 will increase its area at the apex, reducing the potential density of the memory. The surface 917 may be any suitable dielectric such as $SiO_2$.

A tip array comprises a large number of structures such as those shown in FIG. 9, fabricated in the same body of material, in a regular array interconnected as shown in FIG. 8. In this arrangement, the tips are all adjacent the same surface of the body, and that surface is placed next to the mobile ion memory layer, such as the layer 113 shown in FIG. 1. As discussed above, the tips are individually addressable via unique source line/gate line pairs for reading and writing to the memory layer. Moreover, the entire body containing the tips may be translatable in the plane of its surface via two or more precision piezo electric elements. Thus controlling the voltage applied to the piezo electric elements further allows control of the position, i.e. scanning, of the body housing the tips. It will appreciated that due to the closeness of the body to the mobile ion memory layer, all components other than the tips (e.g. interconnects, etc.) should be recessed away from the surface of the body to avoid affecting the reading or writing of data.

Those of skill in the art will appreciate that the methods and structures described above are usable in many ways. For example, although both reading and writing of the memory are shown, the innovative memory structure may used as a read-only memory. Thus, the memory may be used as RAM or ROM generally, EPROM, EEPROM, etc. without limitation.

It will be appreciated that an improved system and method for high-density data storage and retrieval have been described. In view of the many possible embodiments to which the principles of this invention may be applied, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

I claim:

1. A digital memory storage apparatus comprising:
    a memory layer having a first surface and a thickness;
    a plurality of mobile ions within the memory layer, the respective positions of the mobile ions being responsive, in a direction perpendicular to the first surface, to an electric field applied substantially perpendicular to the first surface with a strength greater than a predetermined threshold strength; and
    a scanning tip array comprising at least one conductive scanning tip positioned near the first surface of the memory layer and being configured to apply an electric field substantially perpendicular to the first surface with a field strength within the memory layer at least as great as the threshold strength.

2. The digital memory storage apparatus according to claim 1, wherein the electric field applied substantially perpendicular to the first surface has a horizontal positional accuracy and horizontal field resolution both corresponding substantially in extent to a group of ions at least as small as an ion and its adjacent neighbors.

3. The digital memory storage apparatus according to claim 1, wherein the scanning array comprises a plurality of conductive scanning tips.

4. The digital memory storage apparatus according to claim 3, wherein each of the plurality of conductive scanning tips comprises a drain of a transistor, wherein the transistor further comprises a source and gate, and wherein the source is connected to a source line and the gate is connected to a gate line, such that each transistor is individually addressable by a unique pair of gate line and source line.

5. The digital memory storage apparatus according to claim 1, wherein the memory layer comprises silicon dioxide.

6. The digital memory storage apparatus according to claim 1, further comprising a substrate layer in contact with a second surface of the memory layer that is substantially parallel to the first surface.

7. The digital memory storage apparatus according to claim 6, wherein the substrate layer comprises crystalline silicon.

8. The digital memory storage apparatus according to claim 6, wherein the substrate layer comprises an electrically conductive material.

9. The digital memory storage apparatus according to claim 1, wherein the memory layer thickness is between about 3 nm and about 20 nm.

10. The digital memory storage apparatus according to claim 1, wherein the plurality of mobile ions are of one or more types selected from the group consisting of alkali metal ions.

11. The digital memory storage apparatus according to claim 10, wherein the plurality of mobile ions comprise sodium ions.

12. A method of making a digital memory comprising the steps of:
positioning a memory layer of material on a substrate, the memory layer having a first surface in contact with the substrate and a second surface substantially parallel to the first surface;
placing mobile ions within the memory layer, the respective positions of the mobile ions in a direction perpendicular to the first surface being responsive to an electric field applied substantially perpendicular to the first surface at greater than a predetermined threshold strength;
conditioning the memory layer so that substantially all of the mobile ions reside at one of the first and second surfaces; and
positioning a scanning tip near the second surface of the memory layer, whereby the scanning tip is adapted to apply an electric field having at least the predetermined threshold strength to move the mobile ions within the memory layer.

13. The method according to claim 12, wherein the step of positioning a memory layer of material on a substrate comprises depositing the memory layer on the substrate.

14. The method according to claim 12, wherein the step of positioning a memory layer of material on a substrate comprises growing the memory layer on the substrate.

15. The method according to claim 12, wherein the memory layer comprises a silicon oxide.

16. The method according to claim 12, wherein the step of placing mobile ions within the memory layer comprises using ion implantation after the step of positioning the memory layer on the substrate.

17. The method according to claim 12, wherein the step of placing mobile ions within the memory layer occurs during the step of positioning the memory layer on the substrate.

18. The method according to claim 12, wherein the step of conditioning the memory layer so that substantially all of the mobile ions reside at one of the first and second surfaces comprises:
placing a terminal on the second surface of the memory layer;
heating the memory layer to an elevated temperature to increase ion mobility; and
while the memory layer is at an elevated temperature, applying a bias voltage to the terminal relative to the substrate, whereby substantially all of the mobile ions are caused to move to or remain at one of the first and second surfaces.

19. The method according to claim 18, further comprising, after the step of applying a bias voltage while the memory layer is at an elevated temperature, the step of cooling the memory layer to a temperature substantially lower than the elevated temperature to hinder thermal ion mobility while still applying the bias voltage.

20. The method according to claim 18, wherein the step of placing a terminal on the second surface of the memory layer comprises depositing a conductive layer on the second surface of the memory layer.

21. The method according to claim 18, wherein the step of placing a terminal on the second surface of the memory layer comprises moving a conductive wafer into contact with the second surface of the memory layer.

22. The method according to claim 18, further comprising the step of removing the terminal from the second surface of the memory layer after the step of applying a bias voltage to the terminal relative to the substrate.

* * * * *